United States Patent [19]

Prager et al.

[11] 4,215,386
[45] Jul. 29, 1980

[54] MODULAR PANEL CONSTRUCTION FOR PROGRAMMABLE CONTROLLER

[75] Inventors: Jay M. Prager, Hudson, N.H.; Joseph F. Sadlow, North Reading, Mass.; John E. Farrand, Nashua, N.H.; Thomas A. Boissevain, Bedford; Roman Y. Gonzales, Andover, both of Mass.

[73] Assignee: Modicon Division, Gould Inc., Andover, Mass.

[21] Appl. No.: 883,277

[22] Filed: Mar. 3, 1978

[51] Int. Cl.² .................................... H05K 5/00
[52] U.S. Cl. .................................... 361/394; 361/390
[58] Field of Search ............... 361/395, 394, 393, 415, 361/410, 390; 339/176 MP, 198 P

[56] References Cited

U.S. PATENT DOCUMENTS

| | | | |
|---|---|---|---|
| 2,566,425 | 9/1951 | Paine et al. | 339/198 P |
| 2,882,513 | 4/1959 | Olashaw | 339/198 P |
| 3,316,525 | 4/1967 | Bernutz | 339/176 MP |
| 3,609,462 | 9/1971 | De Barros | 361/415 |
| 3,972,077 | 3/1976 | Powers | 361/393 |
| 3,993,936 | 11/1976 | Meade et al. | 361/410 |

FOREIGN PATENT DOCUMENTS

| | | | |
|---|---|---|---|
| 2214537 | 10/1973 | Fed. Rep. of Germany | 361/415 |
| 1340580 | 12/1973 | United Kingdom | 361/415 |

*Primary Examiner*—David Smith, Jr.
*Attorney, Agent, or Firm*—Mattern, Ware, Davis & Stoltz

[57] ABSTRACT

By providing a plurality of input/output housings which are removably connected to a controller interconnecting duct, with each input/output housing accommodating a plurality of input/output modules that are quickly and easily removably connected thereto, an input/output assembly for a programmable controller is achieved capable of rapid field assembly and field disassembly for removal or replacement of any necessary parts. In the preferred embodiment, all connectors in the programmable controller assembly are solderless connections, thereby allowing complete removal and replacement of connectors in the field without soldering. Furthermore, the input/output modules are lightweight and easily handled for quick insertion or removal from the plugged-in housing connections.

20 Claims, 21 Drawing Figures

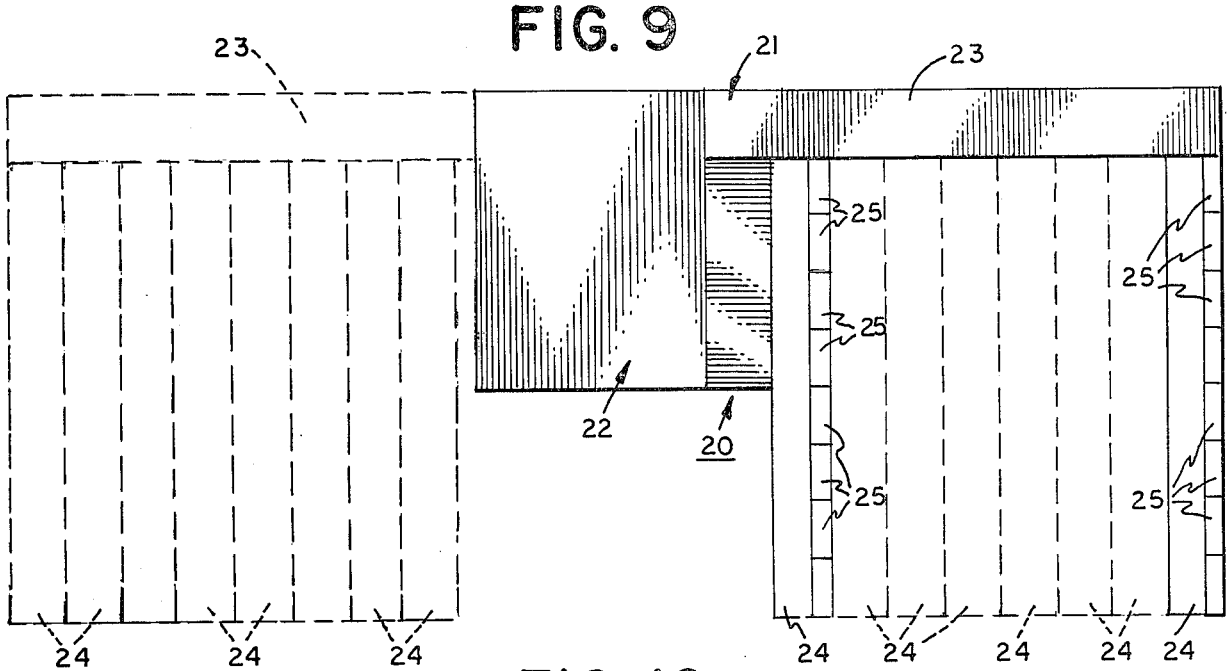
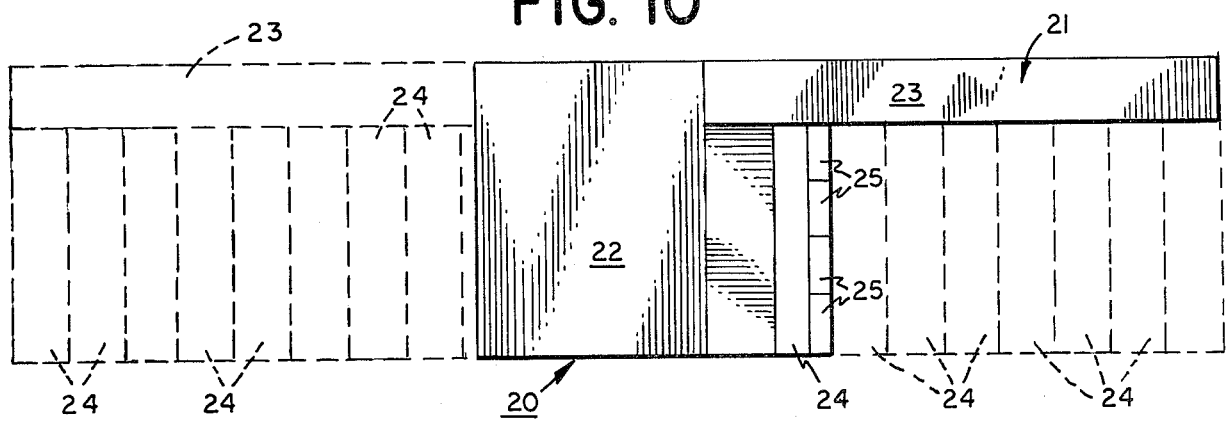
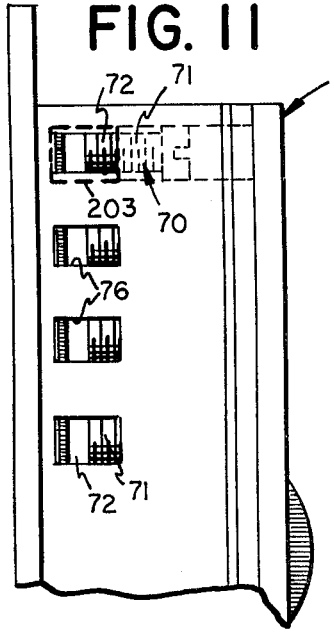
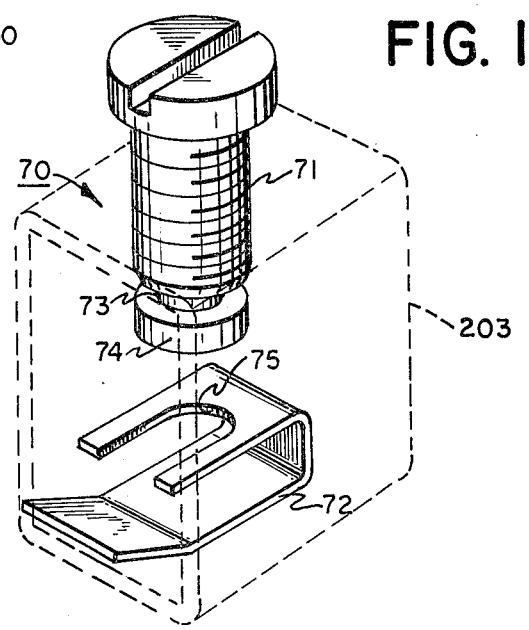

MODULAR PANEL CONSTRUCTION FOR PROGRAMMABLE CONTROLLER

BACKGROUND OF THE INVENTION

This invention relates to programmable controllers and more specifically to an input/output system therefor.

In most prior art programmable controllers, the input/output systems are generally constructed in a manner which requires the equipment connected thereto to be disconnected whenever a panel is removed, replaced, or in any way rearranged. As a result, an expensive, time-consuming effort is required to accomplish the necessary maintenance and field wiring.

Another problem common with most prior art programmable controllers is the necessity for shutting down the entire controller whenever an individual input/output circuit needs to be replaced or repaired. Similarly, this type of construction produces excessive down-time and increased burden on replacing and removing the input/output circuits. Furthermore, the input and output circuits are typically fixed with a particular address that is not easily changed.

The best prior art patent, of which we are aware, is U.S. Pat. No. 3,942,077 of Howard A. Powers. In Powers, a modular panel construction for an input/output assembly is disclosed which eliminates many previous prior art problems. In Powers, interconnecting input/output panel housings are employed with each panel housing accepting up to four removable input/output modules. Furthermore, the input/output modules are capable of being directly plugged into the input/output panel housing and have fixed terminals to which external equipment is connected. In this way, the necessity for disconnecting and reconnecting external equipment wiring during removable or replacement of the input/output modules is eliminated.

In spite of the advance made by Powers, the modular panel construction disclosed therein suffers from various difficulties which have heretofore remained unresolved. Some of these difficulties include input/output modules which are heavy and cumbersome to use, and require supporting tracks and camming systems to assure secure and complete interconnection of the input/output module with the input/output panel housing. As a result, ease of handling and speed of installation and removal of the modules is hampered.

Additionally, the connectors of Powers between the input/output modules and the input/output housing were fixed and located in readily inaccessible positions. Consequently, any connector failure required the complete disassembly of the input/output system, removal of the connectors, and resoldering of new connectors to the I/O housings.

Therefore, it is a principal object of this invention to provide an input/output assembly for a programmable controller which incorporates a lightweight, easily handled, input/output module capable of quick and easy insertion, removal and replacement without necessitating removal of the external devices wired thereto.

Another object of this invention is to provide an input/output assembly for a programmable controller having the characteristic features defined above wherein the input/output module can be inserted and connected to the input/output housing at an angle and swung into interconnected engagement with an external device wiring strip.

Another object of this invention is to provide an input/output assembly for a programmable controller having the characteristic features defined above which is capable of complete removal and replacement of all connectors without soldering, thereby assuring easy and reliable field maintenance.

A further object of the present invention is to provide an input/output assembly for a programmable controller having the characteristic features defined above which also provides protection against electromagnetic interference without requiring the use of shielded cables.

Another object of the present invention is to provide an input/output assembly for a programmable controller having the characteristic features defined above which also provides for quick and easy interconnection of external device wiring having up to two number 12 wires per connection point.

Another object of the present invention is to provide an input/output assembly for a programmable controller having the characteristic features defined above wherein the address for the input/output housing can be individually set for each input/output housing prior to interconnection with the central processing unit.

Other objects of the invention will in part be obvious and will in part appear hereinafter.

SUMMARY OF THE INVENTION

The input/output assembly for a programmable controller of the present invention eliminates the prior art difficulties by providing a small, lightweight, easily handled input/output module which can be interconnected with the back plane of an input/output housing at an angle and then moved laterally into secure engagement with a terminal strip which is connected to the output or input lines from the external devices. Furthermore, the input/output housing is interconnectable with the programmable controller through an interfacing duct which incorporates an input/output bus cable having a connector mounted to the cable for each housing mounted to the duct. In this way, the printed circuit board within each input/output housing is easily electrically connected to the central processing unit of the programmable controller via the input/output bus cable.

Additionally, the input/output housing is physically connected to the duct through bottom openings in the duct in order to assure easy installation, assembly, and disassembly when necessary.

The input/output assembly of the present invention further incorporates input/output modules which accept standard AC or DC inputs for limit switches, pushbuttons, pressure switches, etc., and drive AC or DC outputs such as solenoids, indicator lights, motor starters, etc. In one embodiment, each input/output housing accommodates up to eight input/output modules, with each module having four input/output points for controllable interconnection with four external devices. In another embodiment, the input/output housing accommodates up to four input/output modules with each module accommodating four points. With these two preferred construction variations, the particular input/output requirements and physical installation constraints of a customer can be satisfied without necessitating the purchase of additional equipment, while also allowing for future expansion.

Each input/output housing of the present invention also incorporates a housing or strip-switch to provide a selectable address for communication from the controller's central processing unit. Furthermore, in the four module housing, byte select address switches are provided for each pair of modules in order to designate a desired byte address. For user convenience, the eight module housings are preferably pre-wired with the byte address, thereby leaving only select switches.

The versatility, field maintainability and expandability of the input/output assembly of this invention is further enhanced by providing input/output housings which are easily and rapidly connectible to the interfacing duct and can be quickly and easily removed for repair or maintenance. Furthermore, the entire input/output assembly is easily disconnectible with the connections thereof between the input/output housing and the input/output modules being removable for replacement without soldering.

The invention accordingly comprises the features of construction, combination of elements and arrangement of parts which will be exemplified in the construction hereinafter set forth, and the scope of the invention will be indicated in the Claims.

THE DRAWINGS

For a fuller understanding of the nature and objects of the invention, reference should be had to the following detailed description taken in connection with the accompanying drawings in which:

FIG. 9 is a schematic front elevation view of the maximum input/output module capacity for the input/output assembly of the present invention;

FIG. 10 is a schematic front elevation view of the expandable input/output module capacity for the input/output assembly of the present invention in another embodiment;

FIG. 11 is a side elevation view partially broken away of the terminal connector strip of the input/output housing of the present invention;

FIG. 12 is an exploded perspective view of a trap-screw assembly incorporated within the terminal connector strip of FIG. 11;

Figure 13A:
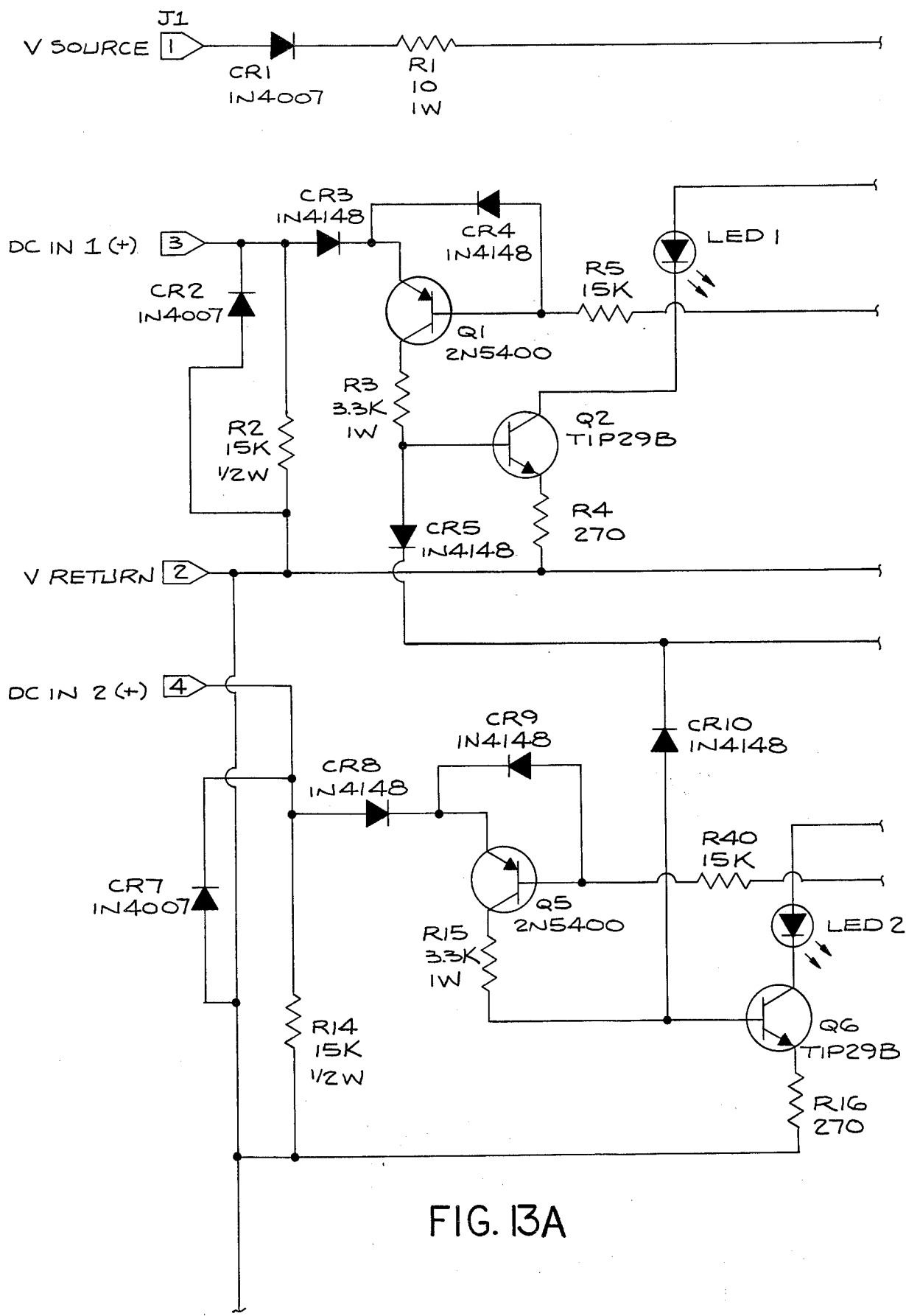
Figure 13B:
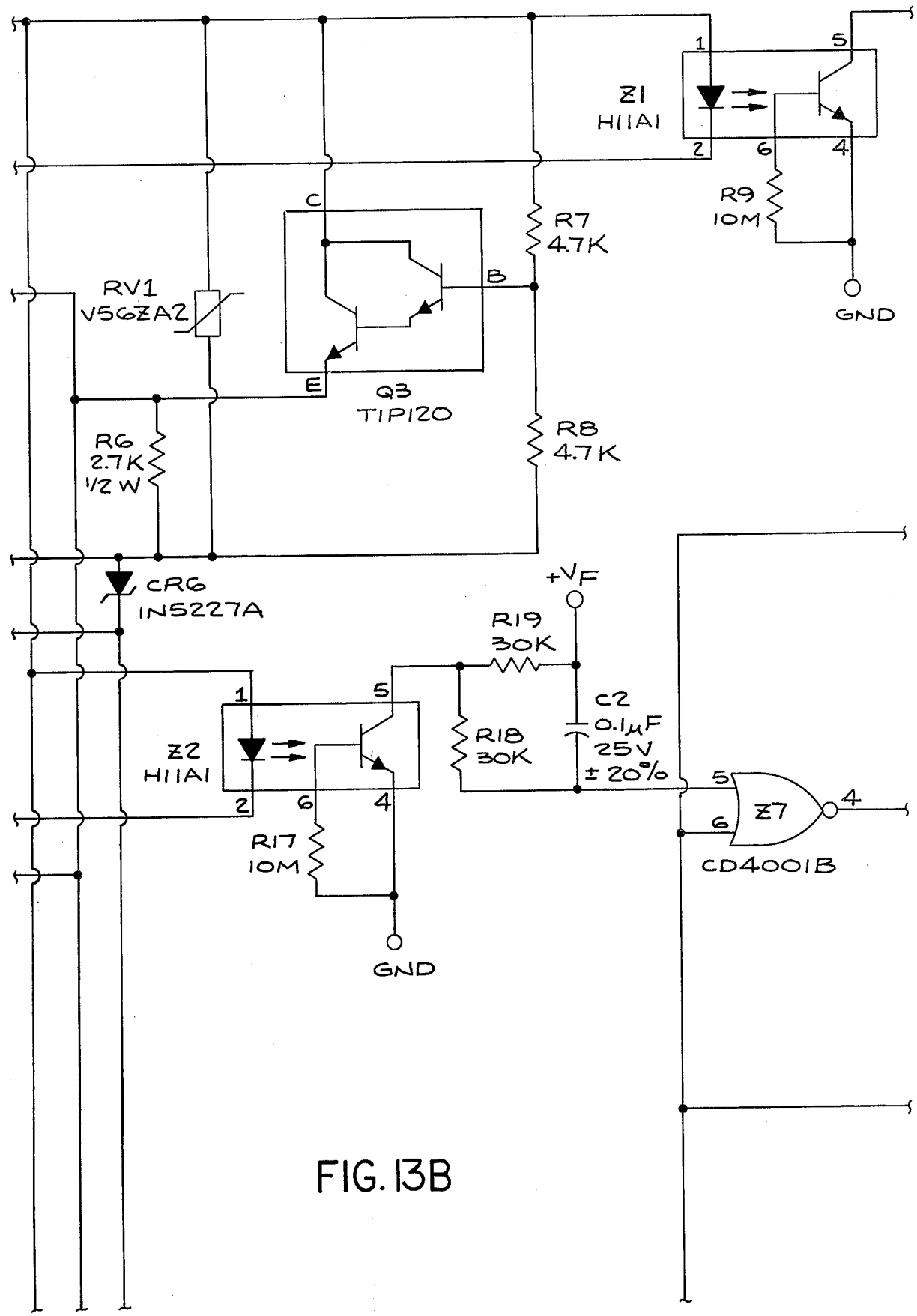
Figure 13C:
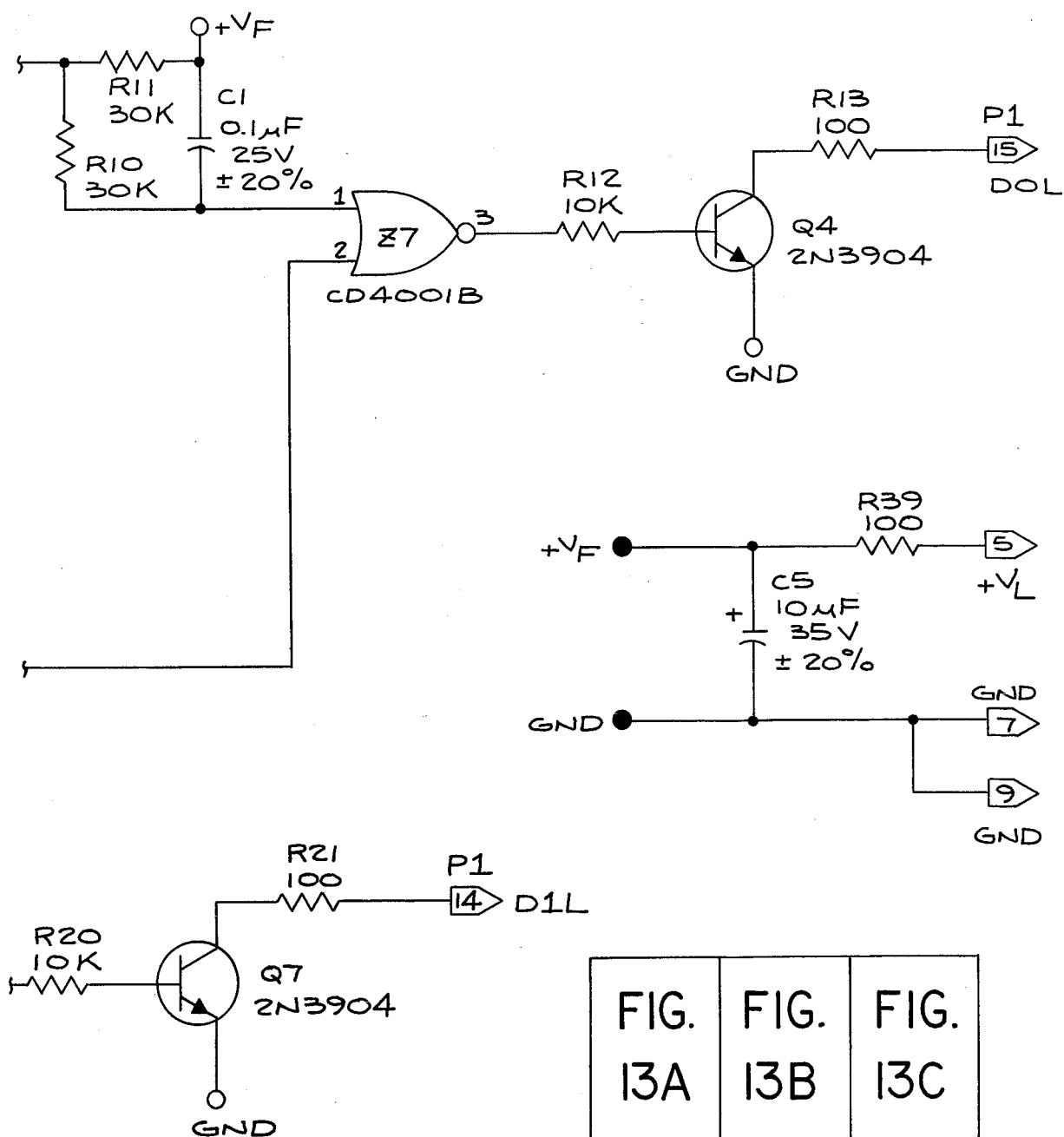
Figure 14A:
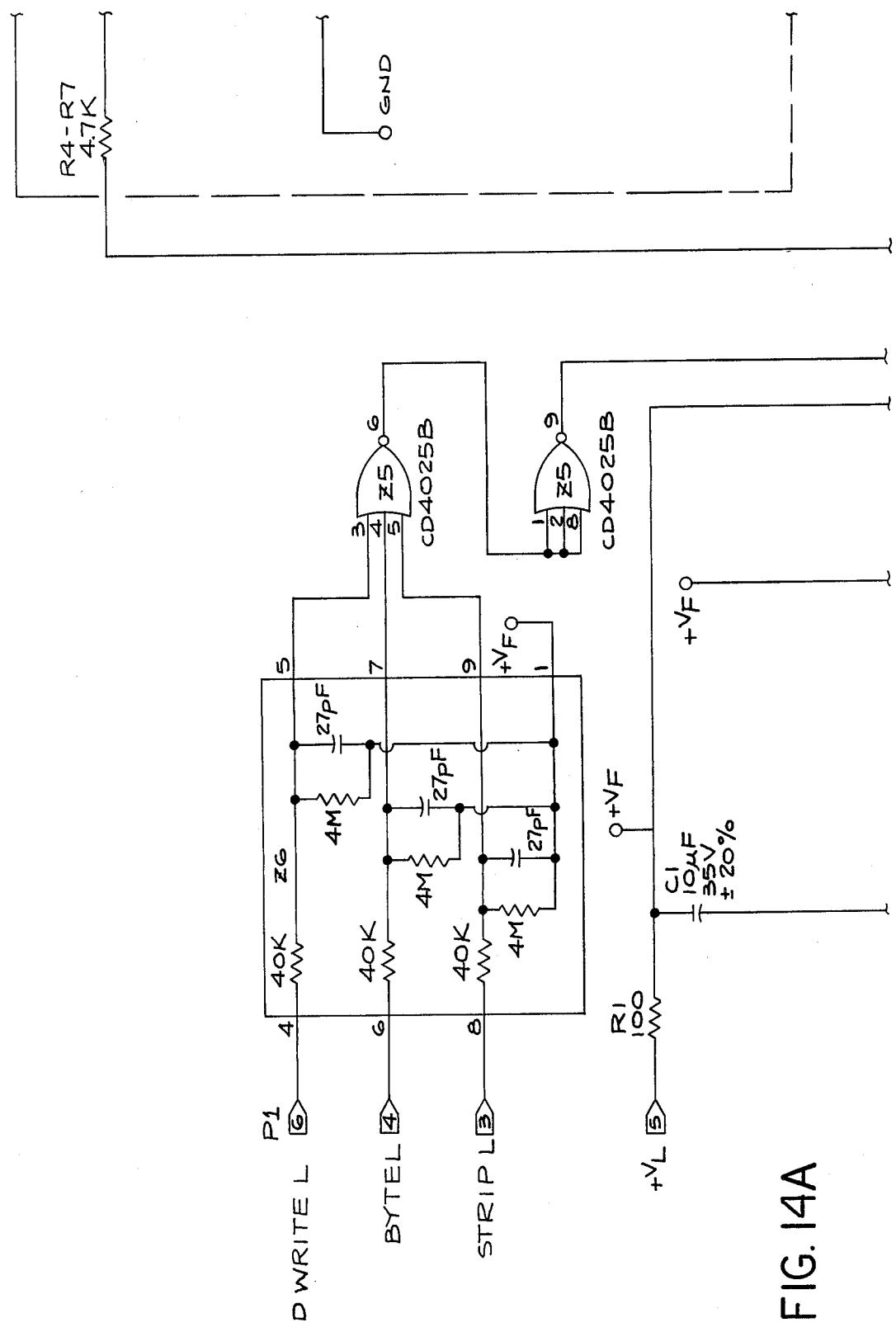
Figure 14B:
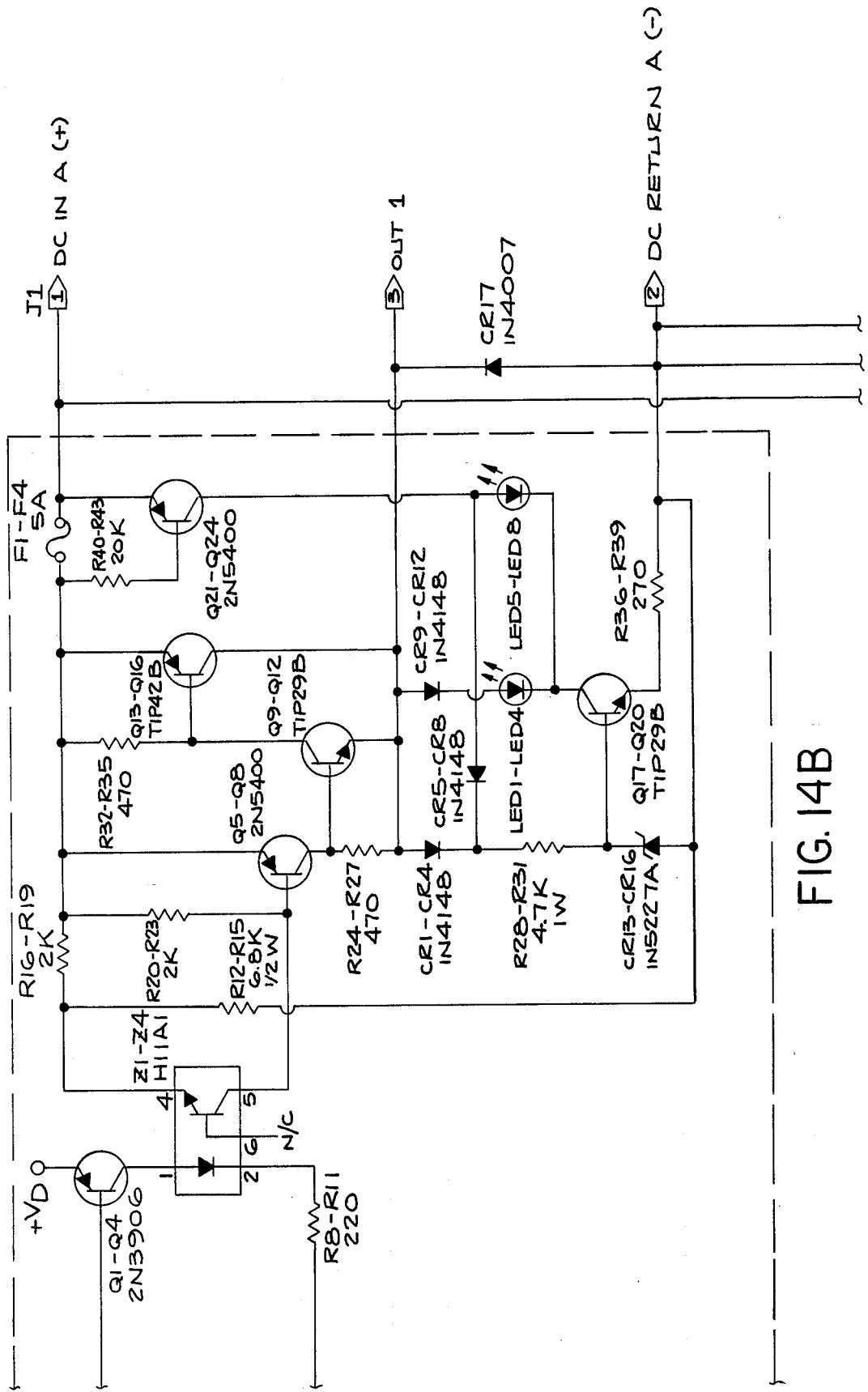
Figure 14C:
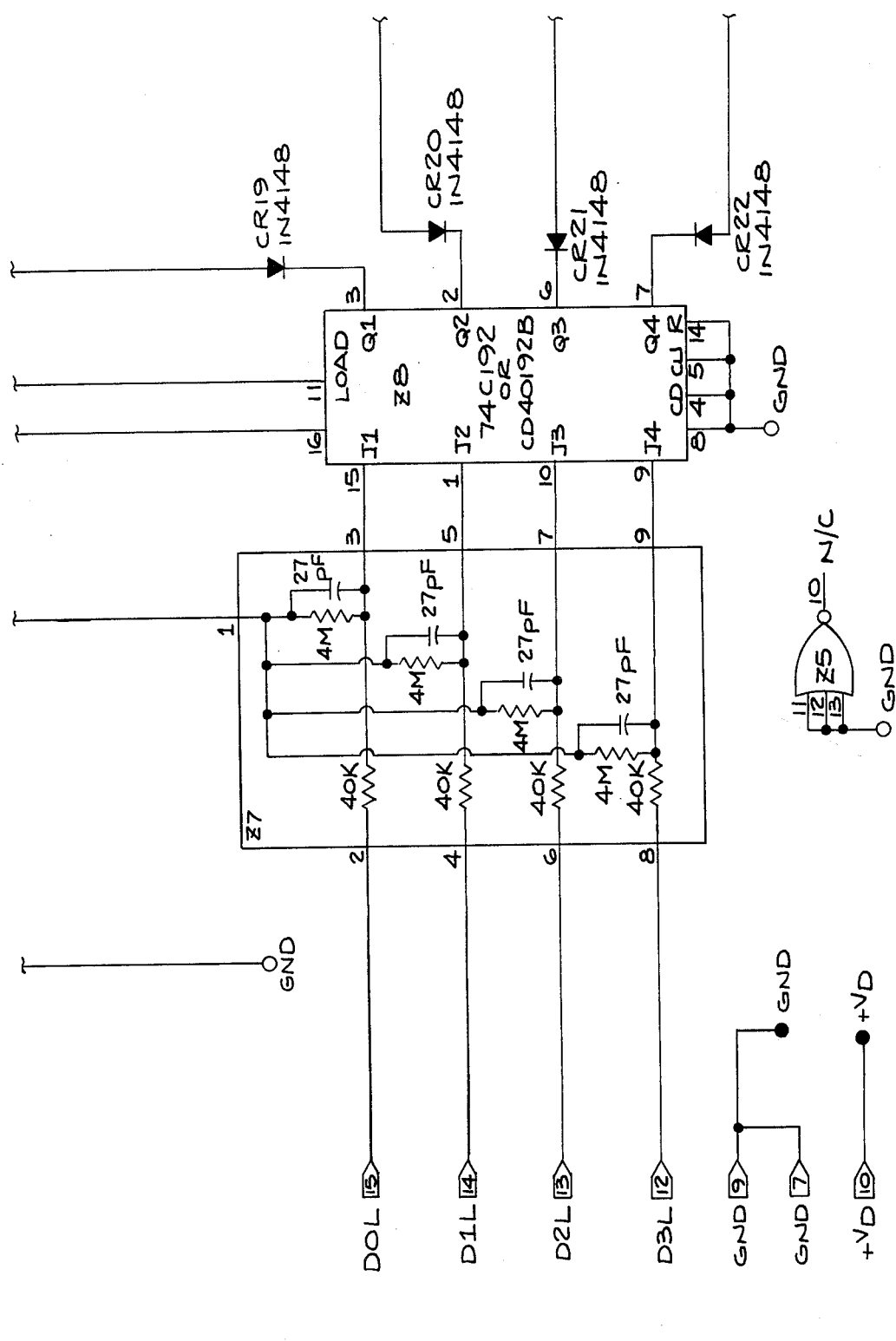
Figure 14D:
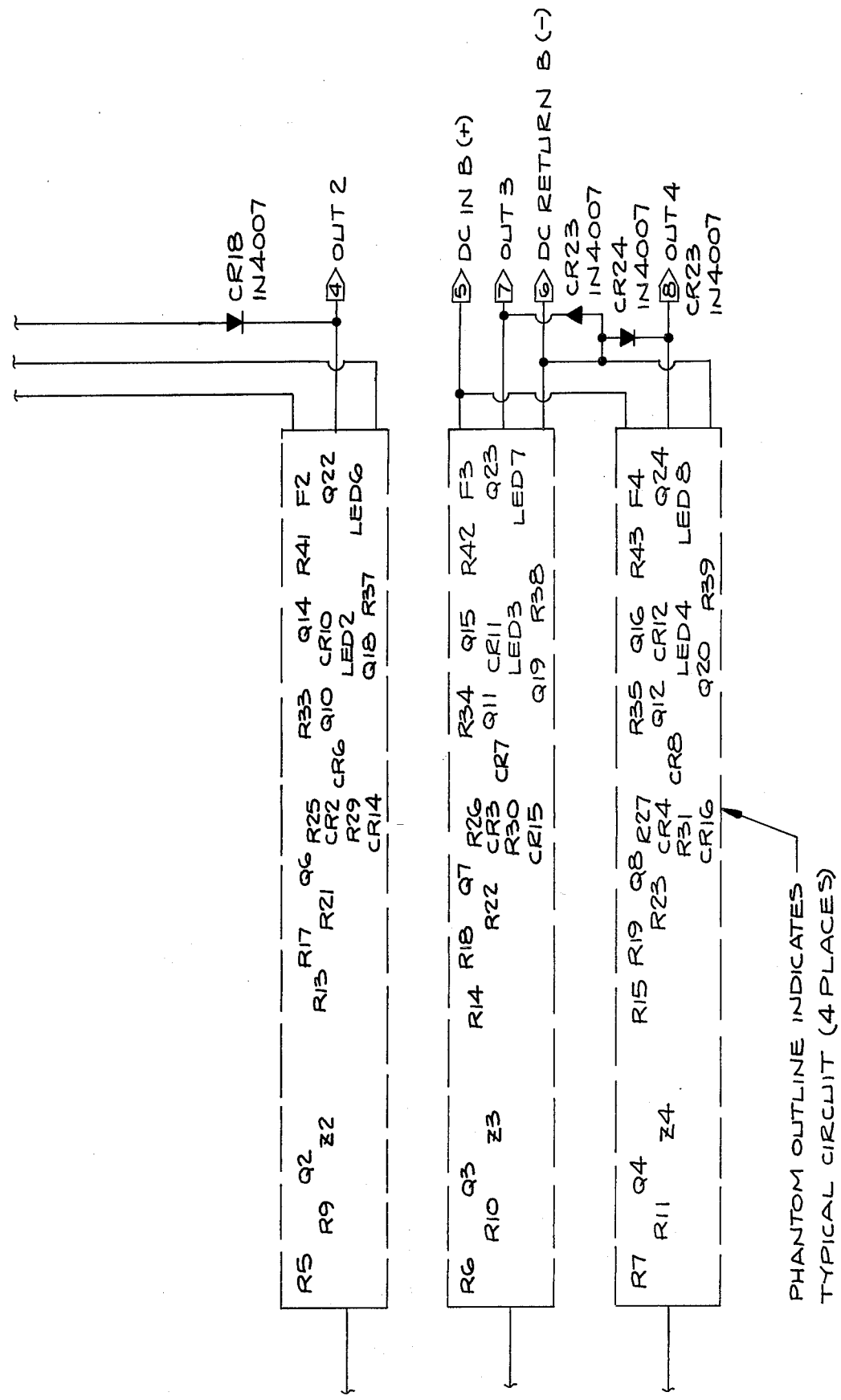
Figure 14E:
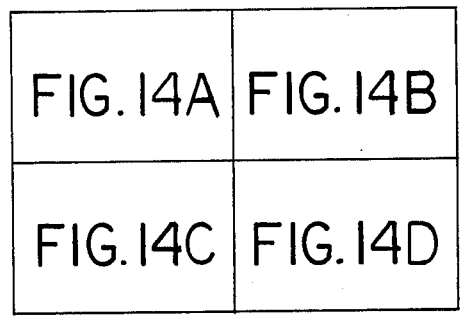

FIG. 13A-C is a schematic diagram of a portion of a DC input module illustrating the threshold circuitry;

FIG. 13D is a schematic diagram showing how FIGS. A-C are put together to form FIG. 13;

FIG. 14A-D is a schematic diagram of the output driver circuitry used in the output modules illustrating dual function circuitry for alternatively driving output indicators and blown fuse indicator; and FIG. 14E is a schematic diagram showing how FIGS. 14A-D are put together to form FIG. 14.

DETAILED DESCRIPTION

Figure 1:
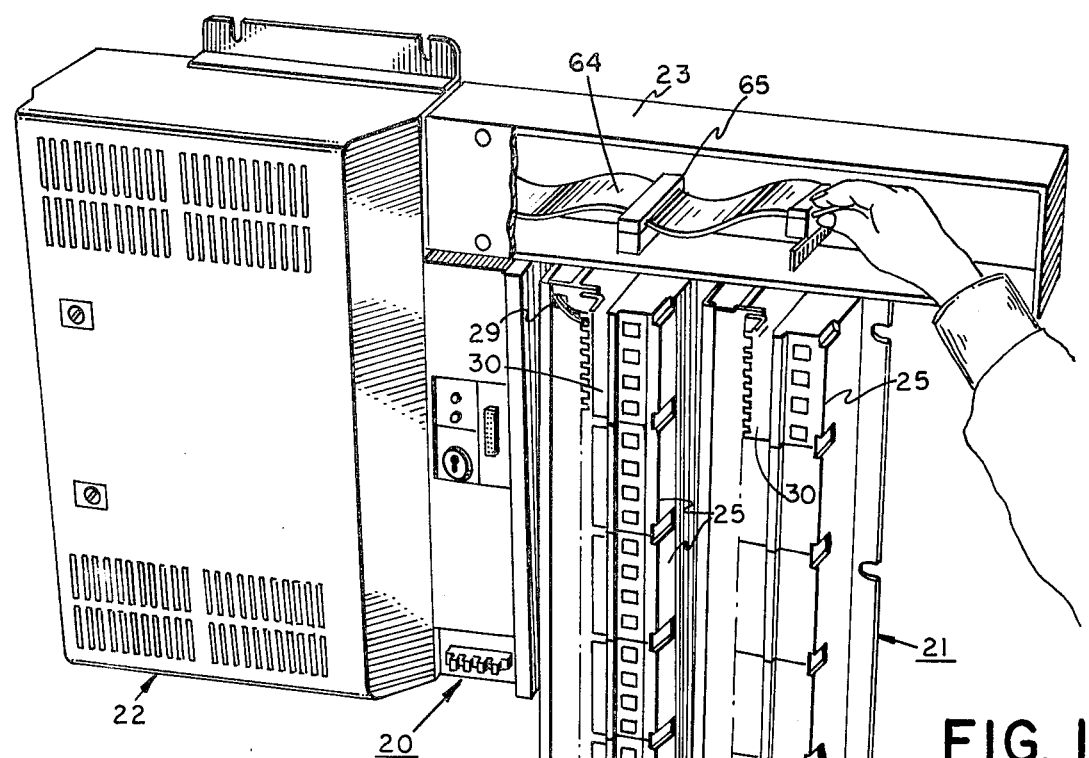
FIG. 1 is a perspective view of the basic programmable controller incorporating the input/output assembly of this invention.

In FIG. 1, programmable controller 20 is shown incorporating input/output assembly 21 and combination central processor memory and power supply forming mainframe 22. As is well known in the art, programmable controller 20 is constructed to receive information from various external equipment, process this information and, in accordance with a particular preset instruction program, provide output information in order to control the particular equipment connected thereto. The mainframe 22 incorporates the user control program, receives the input information from the input modules forming a part of input/output assembly 21, processes the information received, and delivers output instructions to the output modules of input/output assembly 21. The power supply portion of the mainframe drives the central processor and portions of the input/output assembly 21.

As shown in FIG. 1, input/output assembly 21 incorporates an interconnecting duct 23, interconnecting mainframe 22 with input/output housings 24, with each input/output housing supportingly interconnected with a plurality of input/output modules 25. In the embodiment shown in FIG. 1, each input/output housing 24 is supportingly interconnected with eight input/output modules 25. As will be more fully discussed below, the input/output housings of the present invention have two alternative preferred embodiments which accommodate either eight input/output modules or four input/output modules. In this way, unneeded, extra capacity is eliminated, thereby avoiding any unnecessary costs.

In the preferred embodiment, each module 25 incorporates either four input or four output points. The determining factor which makes module 25 either an output module or an input module is solely dependent upon the particular electronic circuitry mounted therein. Each module incorporates specific designations, as well as color coding in order to rapidly inform the operator as to the particular type of module being employed.

As shown in FIG. 9, the programmable controller 20 of this invention may incorporate up to 16 input/output housings with each input/output housing having up to eight input/output modules mounted thereto. In this way, when the entire capacity of programmable controller 20 is employed a total of 512 lines or points of inputs or outputs are accommodated. Of course, as shown in FIG. 10, substantially less capacity can be employed, depending upon the needs of the user, such as employing input/output housings having a maximum of four input/output modules per housing.

Figure 2:
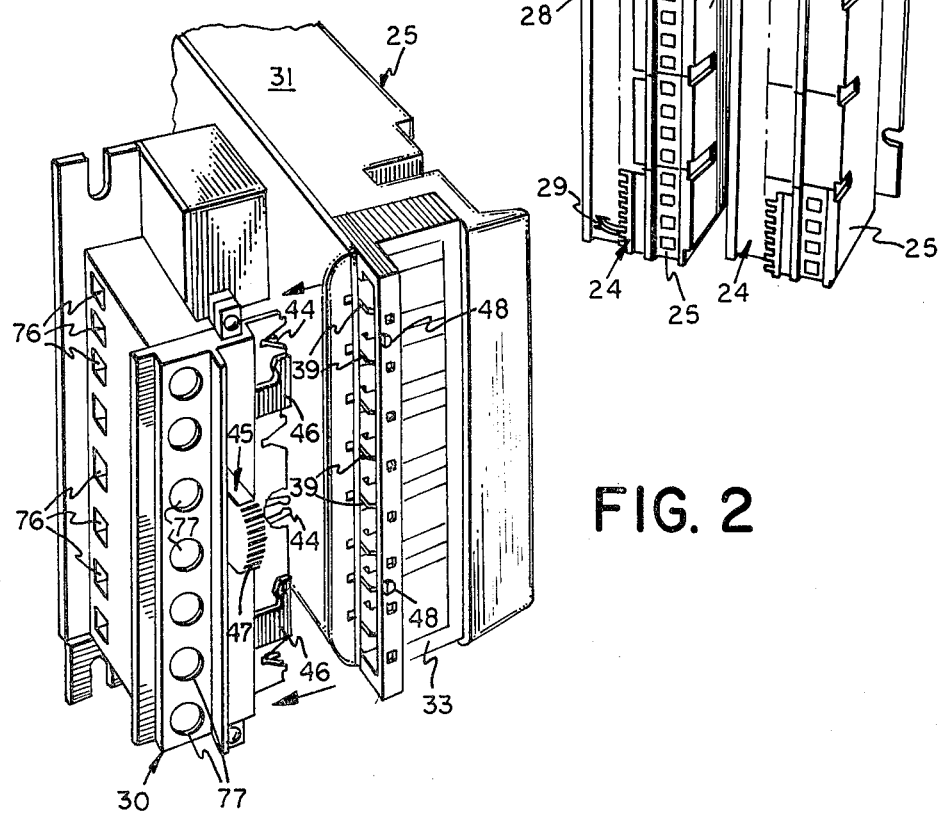
FIG. 2 is a perspective view of one input/output module prior to engagement with a terminal strip.

Referring to FIGS. 1 and 2, input/output housing 24 can best be seen with channel 28 extending throughout the entire length thereof. Channel 28 preferably incorporates a removable side panel and is employed to accommodate the wiring of the external equipment to which input/output modules 25 are connected. In this way, all equipment wiring is conveniently stored in closed channel 28, eliminating any potential hazards.

Furthermore, the ease of installation and use, each channel 28 incorporates a plurality of openings 29 for conveniently extending and holding the wire leads of the equipment wiring to terminal block connector 30 mounted to input/output housing 24. The precise construction and operation of terminal block connector 30 is more fully described below.

As shown in FIG. 1, once the equipment wiring has been extended through channel 28 and connected to the desired location of one of the plurality of terminal block connectors 30 along input/output housing 24, it can readily be seen that the insertion or removal of module 25 does not in any way affect the external equipment wiring, thereby allowing modules 25 to be inserted and removed conveniently without disturbing the external equipment wiring.

Module Construction

By referring to FIGS. 2, 4, 5 and 6, the construction of each input/output module can best be understood. These figures also illustrate the ease and simplicity of installing the input/output modules 25 within input/output housing 24. Each input/output module 25 incorporates a housing member 31, a cover 32, a front panel and module connector assembly 33 and a printed circuit board 34 comprising the electronic assembly specifically for the particular information and equipment to which module 25 will be connected.

Generally, the printed circuit board and components mounted thereon function as an AC or DC input circuit or as an AC or DC output circuit. Generally, modules 25 incorporates conventional input/output circuitry. However, as discussed in detail below, modules 25 employ dual function circuitry to activate either the output indicator or blown fuse indicator of AC and DC output modules. In addition, the DC input circuitry of each DC input module utilizes the interconnection of an external DC voltage source which can act as a reference voltage for the DC inputs to the module. The circuitry includes a threshold portion which interprets DC inputs as ON or OFF depending upon their respective values as compared to the DC voltage source.

Housing 31 incorporates along its side surface a plurality of heat sink fins in order to dissipate the heat generated within the housing from the operation of the electronic circuits contained therein. Furthermore, housing 31 also incorporates dual screw holes 35 along the same side surface thereof in order to interconnect with specific components of the electronic circuit. This adds to the heat sink ability of the housing itself and substantially eliminates the common prior art problem of destruction of the device through thermal fatigue.

Figure 5:
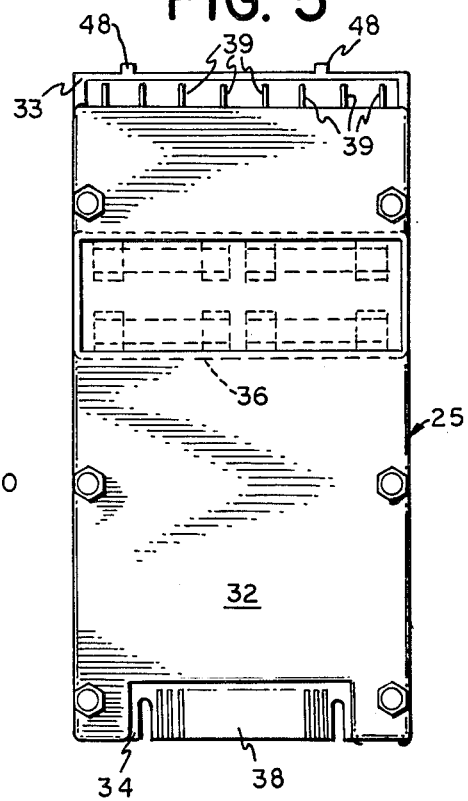
FIG. 5 is a bottom view of the input/output module of the present invention.
Figure 6:
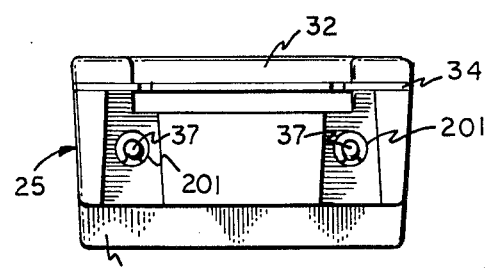
FIG. 6 is an end view of one input/output module of the present invention.
Figure 7:
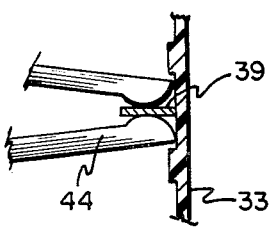
FIG. 7 is an enlarged side elevation view, partially in cross-section and partially broken away, of the interconnecting contact between one connection point of the input/output module with a connection of the terminal strip.

As shown in FIG. 5, cover 32 may comprise a fuse assembly 36 shown thereon in phantom. Fuse assembly 36 is employed on output housings only in order to allow the operator to easily replace any blown fuses.

In order to securely position and engage module 25 with input/output housing 24, housing 31 of module 25 incorporates locator holes 37 formed in the rear surface thereof. As will be more fully described below, the locator holes 37 cooperate with pins 40 formed in the back plane surface of input/output housing 24.

The locator holes 37 act in cooperation with pins 40 to provide the desired position holding and orientation of the edge connector 38 formed as a part of the printed circuit board 34 of module 25. As shown in FIG. 5, edge connector 38 of printed circuit board 34 comprises a separate plug-in type section. Locator holes 37 cooperatively engage with pins 40 of input/output housing 24 allowing edge connector 38 to be easily inserted and securely engaged with the desired logic connector block 41 of input/output housing 24.

Locator holes 37 also serve in conjuction with pressure fitted split bushing 201 and pins 40 to provide electrical grounding between I/o module case 31 and I/o housing 24.

Module 25 also comprises a plurality of connectors 39 positioned along the front edge of module 25 for interconnected, engaged assembly with terminal block connector 30 of input/output housing 24. In the preferred embodiment, module connectors 39 comprise elongated, longitudinally extending fin members, with eight fin connectors 39 for each input/output module. These fin connectors 39 cooperatively engage the eight electrical terminals located in terminal block 30 for cooperative electrical and mechanical engagement with each module 25.

Figure 3:
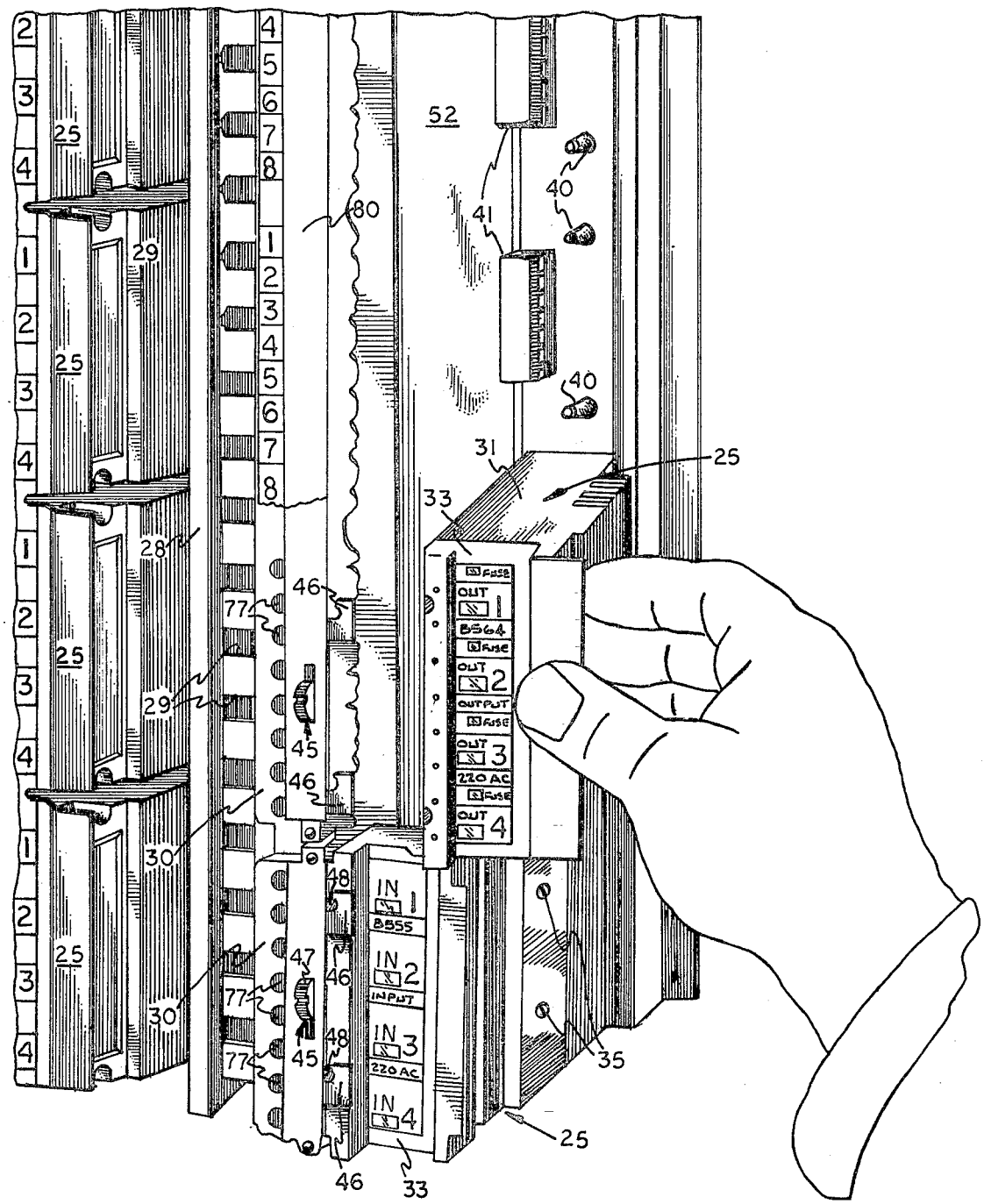
FIG. 3 is a perspective view of the input/output housing of this invention with input/output modules mounted in place and one module being inserted into place.

As is more fully described below in the description of the installation of module 25 with input/output housing 24, connectors 39 of module 25 engage the forked connecting pins 44 contained within terminal block connector 30. As shown in FIGS. 2 and 3, terminal block connector 30 comprises a sideways disposed V-shaped notch along the edge thereof with forked connectors 44 contained within and partially exposed by the V-shaped notch. With this construction, pin connectors 39 of module 25 are capable of being securely engaged with forked pins 44 of terminal block connector 30 by sideways inter-engagement therewith.

As is more fully described below, forked pins 44 are connected directly through terminal block connector 30 to the equipment wiring being controlled.

In the preferred embodiment, fin connectors 39 of module connector 30 comprise a one-piece assembly formed in front panel 33 of module 25. This assembly is preferably constructed in order to allow wave soldering of the entire panel connector assembly along with the desired wave soldering of all components on the printed circuit board 34. Although this construction is preferred for ease of assembly and handling, any alternative assembly for pin interconnection arrangement can be employed.

Module Installation

In order to securely install and electronically engage module 25 with input/output housing 24, the lightweight, easily handled module 25 is lifted and inserted rearwardly into input housing 24 with locator holes 37 of housing 31 of module 25 being initially positioned in cooperation association with pins 40 of input housing 24, shown in FIGS. 3. With the module being located and positioned in the desired plane, module 25 is then rearwardly pushed until edge connector 38 is inserted and securely engaged with logic connector block 41.

In the preferred embodiment, logic connector block 41 comprises a self-contained, solderless flexible connector arrangement in order to allow edge connector 38 of printed circuit board 34 of module 25 to be inserted therein with any desired lateral angular relationship. In this way, the necessity for having complete perpendicular arrangement and secure positioning between the module 25 and logic connector block 41 in exact locations is totally eliminated and flexibility and ease of handling is assured.

Preferably, logic connector block 41 comprises flexible connectors manufactured by AMP Incorporated of Harrisburg, Pennsylvania. Although these connectors are preferred, similar connectors allowing interconnection between two circuit boards while also providing for the flexibility of the connectors in order that the printed circuit boards can be installed at any desired lateral angle relative to one another can also be employed.

Once edge connector 38 of printed circuit board 34 of module 25 has been electrically interconnected with logic connector 41, the final interconnection of module 25 with input/output housing 24 is made by laterally swinging module 25 into secure interlocked, electrically conductive engagement with terminal connector 30. As module 25 is swung into connection with terminal connector 30, the flat fin connectors 39 of module 25 slidingly engage between tuning fork prongs 44 of connector 30. In this way, a reliable electrical contact is repeatedly made without requiring any excessive mating force in order to engage the contacts. Furthermore, the interconnection of connecting fins 39 with tuning forks 44 automatically provides a wiping action assuring clean electrically conductive contact surfaces at all times.

Once module 25 has been inserted into engagement with terminal connector 30, the installation is then completed by securely latching module 25 in position. This secure latching is achieved by moving latch assembly 45 mounted within terminal connector 30. Latch assembly 45, best seen in FIG. 2, incorporates a thumb control button 47 which is interconnected with and controllably moves latching arms 46. In the preferred embodiment, latch assembly 45 is positioned to remain open by the force of gravity. In this way, no specific effort is required by the operator in order to position latch assembly 45 in the open position, thereby simplifying the installation of module 25 with input/output housing 24.

As shown in FIG. 2, panel 33 of module 25 incorporates latching pins 48 which are positioned for cooperative inter-engaged capture by latch assembly 45 of terminal connector 30. Consequently, once module 25 is moved into interconnection with terminal connector 30, latch assembly 45 is engaged by moving thumb control button 47 upwardly until arms 46 peripherally surround and securely latch pins 48 of module 25. In this way, module 25 is securely interconnected and latched with input/output housing 24.

In order to eliminate any possibility of breakage of the latching arms 46 of the latch assembly 45, the latching posts 48 of module 25 incorporate bevelled surfaces that face the latch assembly 45. This bevelled surface is best seen in FIGS. 2 and 5. In this way, if latch assembly 45 accidentally remains in the closed position during the insertion and interconnection of module 25 with input/output housing 24, the bevelled surface of latching post 48 will deflect latching arm 46 of latch assembly 45 upwardly and over post 48 without breaking or otherwise becoming inoperatively deformed. The continued inter-engagement of module 25 with input/output housing 24 will cause latching arm 46 to merely deflect up and over latch post 48 of module 25 and then snap back into position securely engaging post 48. Consequently, secure latching of module 25 is achieved without any system breakage.

Once module 25 has been installed as described above with input/output housing 24, module 25 is ready to provide the full input/output capability contained therein to the equipment to which it has been connected. As shown in FIGS. 2 and 3, each module 25 incorporates four input or output points and eight electrical terminal lines for operative control of the peripheral equipment.

In addition to being lightweight, easily handled, and capable of easy manipulation and user flexibility, module 25 is also sized and constructed so that the entire input/output assembly of this invention can fit into a standard 8 inch deep NEMA cabinet. Furthermore, it is believed that the interconnected engagement of module fin connectors 39 with terminal connector 30 of the input/output assembly comprises an assembly which meets all requirements of UL for industrial applications.

Input/Output Housing-Construction

Figure 4:
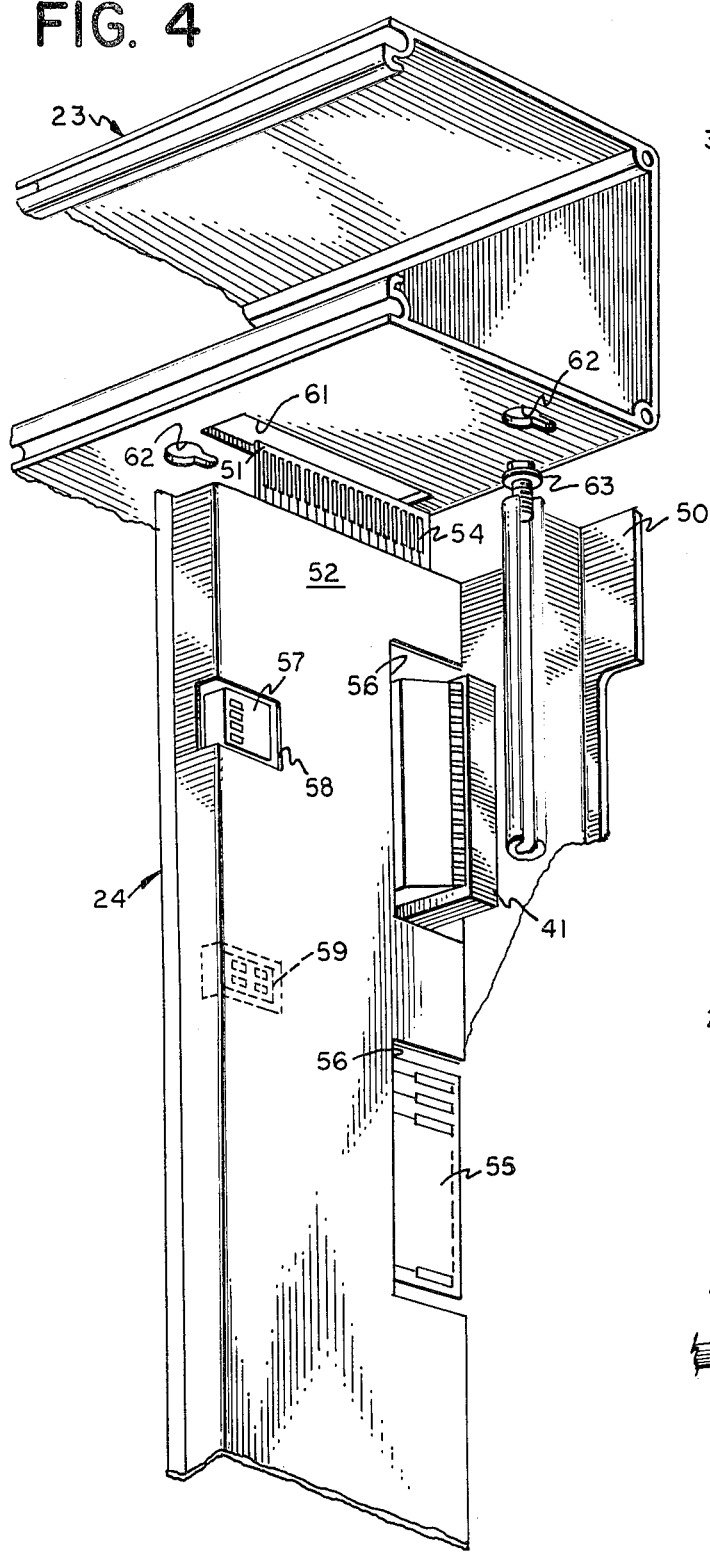
FIG. 4 is a perspective view of the input/output housing of this invention being inserted into the supporting duct therefor.

In FIG. 4, input/output housing 24 is shown being inserted into duct 23 of input/output assembly 21 of the present invention. By first referring to FIGS. 4 and 8, the construction and ease of assembly of input/output housing 24 can best be understood.

Figure 8:
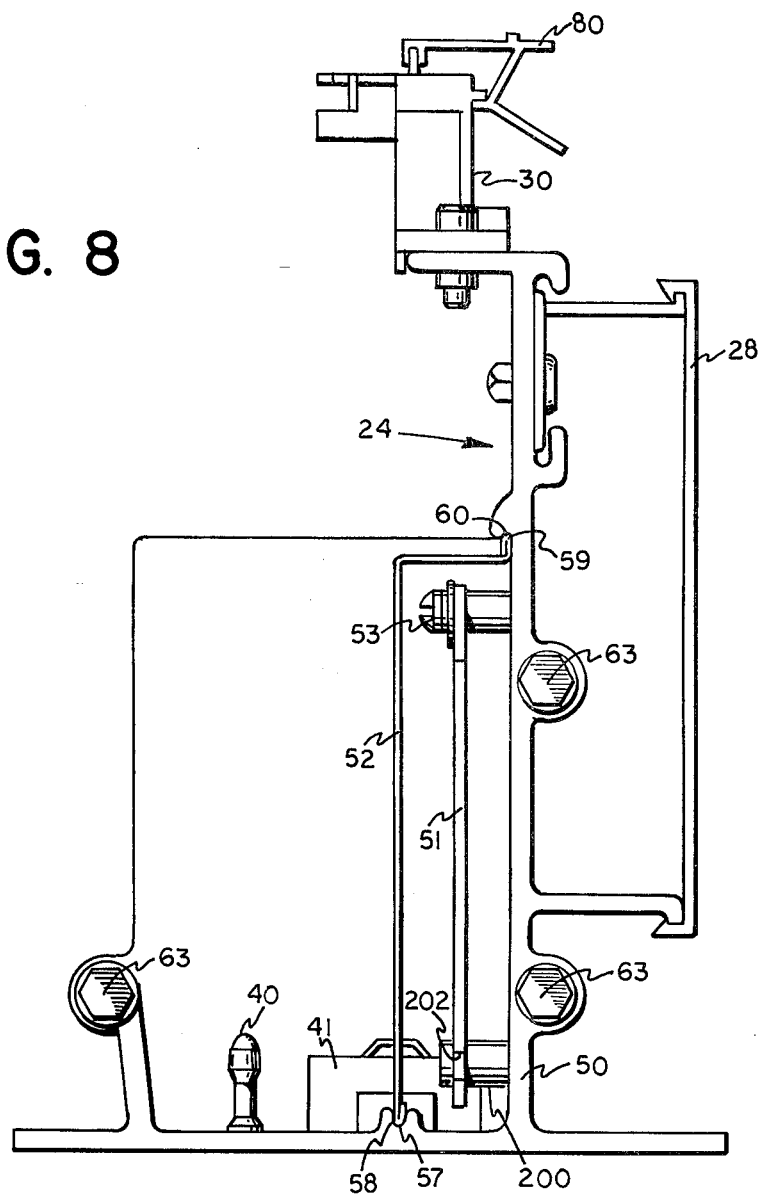
FIG. 8 is a top plan view of the input/output housing of the present invention.

In order to eliminate prior art problems and difficulties encountered in servicing input/output assemblies in use in the field, the input/output assembly of the present invention has been developed to be completely serviceable with ease, as well as employing components which can be easily isolated and replaced if necessary. In order to achieve this goal, input/output housing 24 incorporates mainframe member 50 to which all the various components forming input/output housing 24 are mounted. As best seen in FIG. 8, terminal connector 30 is mounted to the front portion of frame member 50, equipment wiring duct 28 is mounted substantially along one entire side of frame member 50, while the opposed side of frame member 50 accommodates the input/output printed circuit board 51, a shielding cover 52 for printed circuit board 51, as well as logic connector blocks 41 and module cooperating pins 40 both of which are mounted along the rear surface of frame 50.

Printed circuit board 51 extends substantially the entire length of frame member 50 and is quickly and easily installed to frame member 50 by screw means 53. As will be more fully discussed below, printed circuit board 51 incorporates along its top edge thereof, edge connector 54 which interconnects printed circuit board 51 with central processing unit and power supply 22.

Printed circuit board 51 also incorporates side edge connectors 55. Depending upon whether the input/output housing is a four module housing or an eight module housing, printed circuit board 51 employs either four or eight side connectors 55. During the installation of printed circuit board 51 to frame 50 of input/output housing 24, flexible logic connector board 41 is engaged with each of the side edge connectors 55 of printed circuit board 51. Then, with logic connector blocks 41 securely engaged to edge connectors 55, printed circuit board 51 is securely mounted to frame 50 of input/output housing 24. The Grooves 202 in the P.C. board 51 cooperatively engage with the grooved pins 200 at the rear edge of the board so as to provide rigid mounting of rear edge of board. This allows easy replacement and removal of P.C. board without the need for using tools in the confined rear area of the housing. In this way, flexible pin logic connectors 41 are in position ready for engagement with edge connectors 38 of input/output modules 25. For exemplary purposes only, FIG. 4 shows an edge connector 55 with logic connector 41 removed therefrom.

Once printed circuit board 51 and logic connectors 41 have been mounted to frame 50 of input/output housing 24, shielding cover 24 is snapped into place enclosing printed circuit board 51. In order to assure ease of installation and handling, cover 52 incorporates either four or eight cutouts 56 in order to accommodate the laterally extending logic connectors 41. With cutouts 56 positioned in the proper location, rear vertical edge 57 of cover 52 is inserted in channel 58 of housing 50 and then securely locked into position by quickly and easily snapping forward vertical edge 59 of cover 52 into secure locked engagement with channel 60 of frame 50. In this way, cover 52 encloses and protects printed circuit board 51 as well as shielding printed circuit board 51 from any effects from electromagnetic interference (EMI). Furthermore, cover 52 is easily and quickly removable, if necessary, in order to repair or replace either printed circuit board 51 or logic connectors 41.

Addressing System for Input/Output Housing and Modules

Printed circuit board 51 also incorporates a switch assembly 57 and cover 52 incorporates a cutout 58 which is in cooperative spaced juxtaposed position to switch assembly 57 in order to allow ease of operation of switch assembly 57 by the user. As will be more fully discussed below, switch assembly 57 is employed for allowing the user to select the particular numerical address for each input/output housing. With the input/output assembly of the present invention designed for input/output housings in groups of four, select switch assembly 57 allows the operator to provide each individual input/output housing with a numerical address of 1, 2, 3, or 4.

With this addressing arrangement, up to eight housings can be accommodated, providing no two input or output modules have identical addresses. If more than eight housings are required, a housing extender is employed along with additional circuitry to achieve the expanded address requirements.

As shown in FIGS. 9 and 10, input/output assembly 20 of the present invention can accommodate up to a maximum of 16 input/output housings 24 with each of the housings being connected up to a maximum of eight modules 25. If desired, input/output housings 24 and modules 25 can be mounted on either side of central processing unit and power supply 22 or on both sides thereof, provided a maximum of 16 units are employed.

In FIG. 10, an alternative construction of input/output assembly 21 is shown wherein each input/output housing 24 accommodates a maximum of four input/output modules 25. This four module construction is employed for installations where either size or equipment constraints necessitate a smaller unit. As discussed above, input/output housings 24 and input/output modules 25 can be mounted on either side of central processing unit and power supply 22 or with any combination of both sides being employed.

When a maximum of eight input/output housings are employed with a central processing unit and power supply, address selector 57 allows the user to select an address for the particular input/output housings from 1 through 4. Next, each input/output module contained within the input/output housing must be properly addressed. In the input/output housings which accommodate eight input/output modules, the particular module location is provided by hard wiring a byte location for each module directly in printed circuit board 51. Since each byte incorporates eight bits of data, byte 1 addresses modules in position 1 and 2, byte 2 addresses modules in position 3 and 4, byte 3 addresses modules in position 5 and 6, and byte 4 addresses modules in position 7 and 8. Since the byte address is hard wired directly on printed circuit board 51, the user need only provide the input/output housing with the desired numerical address from 1 though 4 and all other addressing is done automatically.

In order to provide greater flexibility for users employing the four module input/output housings, the byte address for the modules is not hard wired directly on the printed circuit board and instead the four module intput/output housings incorporate two additional switch assemblies 59, which are shown in FIG. 4 in phantom. These switch assemblies 59 allow the operator to select a byte address of 1 through 4 for the four modules installed on each input/output housing 24. Since one byte address accommodates two modules, only two select switches are required for each input/output housing.

The final signal which is received by an input or output module before the input state information which the input module has is communicated to the controller or before the output module will accept output state information from the controller and drive the equipment connected thereto is a read signal or a write signal. Consequently, each input/output module will provide the desired function only when that module has received signals in the form of an input/output housing address, a byte location, and finally the read or write signal. The read signals activate the input modules and the write signals activate the output modules.

Since each input/output housing has a housing address from 1 through 4 and up to eight input/output housings can be employed in the controller without an extender and additional circuitry, it is apparent that two modules may have an identical address. As a result, although complete discretion of module location is provided to the user, the only requirement is that if an input module has a specific address in the first four input/output assemblies, an output module must be positioned in the same location in the next set of four input/output housings. In this way, any unwanted dual addressing or dual operation from a single address is avoided. Of course, in some instances two modules may be desired to be activated by the same signal and if such is the case, two modules having the same address and both being either input modules or output modules will be activated by identical incoming signals.

Another important feature incorporated in the input/output assembly of the present invention is that once the modules have been activated by the proper address for that particular module pair, the modules respond as pairs and dump their data out in parallel. Consequently, once a particular strip address, byte address, and write command has been directed to a pair of output modules, each module with its four data points automatically and simultaneously provides the eight data bits of information to the peripheral equipment to which they are connected.

Input/Output Housing Installation

In FIG. 4, the ease and convenience with which input/output housing 24 is rapidly and quickly installed into duct 53 can best be understood. As shown therein, duct 23 incorporates a readily removable front cover in order to allow access to the inside of duct 23. Furthermore, duct 23 incorporates along its bottom surface a rearwardly extending elongated slot 61 and three keyhole slots 62.

Input/output housing 24 is interconnected with duct 23 by aligning printed circuit board 51 with elongated rearwardly extending slot 61 while also aligning screw members 63 threadedly engaged at the top of frame member 50 with keyway slot 62. The head of screw means 63 is inserted through the larger diameter portion of keyway slot 62 and then the entire input/output housing assembly 24 is moved rearwardly until screw means 63 are engaged about the smaller portion of keyway slot 62. Input/output housing 24 is then secured into this position by tightening screw means 63. In this way, input/output housing 24 is now securely engaged and supportingly held with duct 23.

This quick and simple installation procedure assures easy system construction in any desired location, as well as quick and simple disassembly, if necessary, without requiring any exotic equipment.

Installation and Operation of Bus Cable

Once input/output housing 24 has been securely mounted to duct 23, input/output housing 24 is redy for electrical interconnection with central processing unit and power supply 22. By referring to FIG. 1, this interconnection can be best understood.

Duct 23 provides a housing for ribbon cable 64 which extends from central processing unit and power supply 22 to the input/output housing 24. In the preferred embodiment, interconnecting cable 64 comprises a simple 50 conductor ribbon cable incorporating connectors 65 which are positioned for interconnection with edge connectors 54 of the printed circuit board 51 of the input/output housing 24. By quickly and easily inserting connectors 65 onto edge connector 54 of printed circuit board 51, each input/output housing 24 is quickly and easily conductively connected to central processing unit and power supply 22.

The simple ribbon cable 64 with its connector 65 provides a quick and easy "daisy chain" type of connector for each of the input/output housings connected to ducts 23. The particular length of cable 64 depends upon the number of input/output housings employed by the user.

In addition to providing ease of assembly and entry, duct 23, with its snap-on cover, provides shielding to 50 connector ribbon cable 64, thereby protecting against any unwanted electromagnetic interference. Consequently, undesirable, unwieldly, shielded cables are avoided while also providing the same desirable results as if shielded cables were employed.

In operation, the 50 conductor input/output bus cable 64 is used to conduct the following information along the 50 lines available. Four lines are employed as input/output housing select lines in order to define which input/output housing is selected. Also, four additional lines are employed to conduct the byte information which selects adjacent pairs of input/output modules in the particular input/output housing. As discussed above, the byte locations of 1 through 4 are either hard wired into the printed circuit board of the input/output housing (in the case of the eight module input/output housing), or are selectable by the user (as in the case of the four input/output module housing). In either case, the byte location addresses to adjacent input/output modules in order to obtain the eight data bits represented by the two modules.

The next eight lines of cable 64 conduct the data information to all input/output modules. These eight lines are parallel and bi-directional, in order to allow the data to be transferred simultaneously in parallel.

Two additional lines are employed as extra data lines and are used for communication with register input/output housings.

The next two lines of cable 64 are used for the read signal and the write signal. Both signals are routed to all input/output modules with the read signal being used to show data from enabled input modules onto the eight data lines, while the write signal is used to strobe data from the data lines into enabled output modules. Additionally, two more lines are used with read and write signals when employing register input/output assemblies. Along these lines, the read signal strobes intput data from enabled register input/output housings into the input/output data lines, while the write signal strobes data from the input/output data lines into enabled register input/output assemblies.

An additional four lines of cable 64 are +VD lines for bringing DC power into the input/output assemblies in order to activate optically coupled LED's positioned within the input/output assembly. An additional four lines of cable 64 are the return sides of the +VD power sources.

An additional five lines of cable 64 are employed as +VL lines which allows DC power for all CMOS logic which is within the discrete input/output assemblies. An additional thirteen lines are used as ground lines and connect back to the return side of the +VL supply at the system power supply. One additional line is an enable line and is used in register input/output assemblies only and serves as a general purpose reset/enable function for these assemblies. The final line is a busy line which is also associated with register input/output assemblies only.

Reliability of Input/Output Modules and Input/Output Housings

To assure and enhance the reliability and useability of input/output housings 24 and input/output modules 25, the printed circuit board 51 of the input/output housing is designed with no active components thereon. Consequently, there is literally nothing in terms of components which can fail, thereby fully maximizing the reliability of the printed circuit board 51 of input/output housing 24. In essence, printed circuit board 51 serves as a means of carrying signals from input/output bus cable 64 down into modules 25.

Each module 25, whether an input or an output module, incorporates a data line indicator in order to inform the user whether or not the particular line is operational. In the case of an inout module, there are four indicators per module with an indicator employed to inform whether or not one input voltage or input level for a particular input line is present. The indicators are always on the user load side. This eliminates the problem typically found in prior art units when the indicator is wired to the logic side, thereby allowing a failure in the module to give a false indication. With the system of the present invention, whenever the light indicator is ON, there is an input present.

In the output module of the present invention, there are eight indicator lights with each of the four information lines having one output indicator light and one fuse light. As with the input modules, the output indicators only go on when the output is physically on and the output indicators are also connected to the user load side.

An additional feature incorporated in the output modules of the present invention is a double function driving circuitry which employs the same current source to drive both the output indicator and the fuse indicator.

Electrical Operation of the Dual Function Driving Circuitry

FIGS. 14A, 14B, 14C and 14D of the input/output assembly includes a universal DC output driver circuit for indicating blown fuse status and output status of both AC and DC I/O output modules. Position J1, pin 1 indicates where the positive side of the user's direct current voltage source is connected. This DC source is in the range of 9 to 56 VDC. Position J1, pin 2 labelled DC RETURN A (minus) connects to the return side of this user's source. This power input is used to drive two of the four output points on an I/O output module. That is, it is capable of driving output points 1 and 2 or 3 and 4, respectively.

Output No. 1 comes off position J1, pin 3 labelled "OUT 1" with a ground reference connected to position J1, pin 2.

The basic output switching circuit comprises an optoisolator Z1 with several stages of gain driving output transistor Q13. When transistor Q13 is ON, current flows into connector J1, pin 1 through Q13 and out into the load via connector J1, pin 3.

The indicator circuit comprises a current source formed by transistor Q17, resistors R36 and R28 and zener diode CR13. When the output is active, the current source has a voltage on it by interconnection from the bus ON position J1, pin 3 and it in turn lights indicator LED 1 which is the output indicator on the I/O output module for that particular I/O point. The description for the functioning of the output indicators and fuse blown indicators for the other three I/O points of an I/O output module is identical to the operation of the circuitry for I/O point 1 and use the same circuit component types. Thus, for example, Output No. 2 uses opto-isolator Z2, etc.

When the output is ON, the indicator is thus ON. When the output is OFF, there is no drive to LED 1 and thus the output indicator is OFF.

Should fuse F1 fail for any reason a bleed current begins to flow through point J1, pin 1 through the base of transistor Q21, through resistor R40, through biasing network formed by resistors R16 and R12, thus turning on transistor Q21. Conduction of transistor Q21 in turn causes current to flow through a blown fuse indicator LED 5 which is on the I/O output module for output point 1. Thus when the fuse is blown, transistor Q21 is turned ON connecting the user DC voltage source to the blown fuse indicator LED 5 while preventing the activation of output status indicator LED 1 by means of diode CR9. Thus, the driver circuitry for both the output indicator and the blown fuse indicator utilize the same user source and the same driving circuitry accomplishing a reduction in the number of components otherwise necessary to achieve these dual functions. It should be noted that when the output indicator LED 1 is ON, the voltage drop across fuse F1 is insufficient to turn on transistor Q21 thus assuring that blown fuse indicator LED 5 will not be ON when the output indicator is ON. Therefore, not only does the circuitry disclosed perform a dual function but it also prevents both indicators from being ON simultaneously.

Lastly, it should be noted that the output indicator showing the status of an I/O output point is only energized when that output point is in fact energized. That is, the output indicator is not directly driven by the logic signals from the programmable controller that come to the I/O assembly via the I/O bus but is energized by the output circuitry itself which is triggered by the logic signal from the programmable controller, thereby insuring the output indicator shows the true state of the output status and not the state of the output status as communicated to the I/O assembly from the programmable controller. This arrangement of energizing the output status indicator prevents the possibility of the output indicator showing the output is in the ON state when, due to failure within the I/O module circuitry, this is not the case.

An additional teaching incorporated in the input/output assembly of the present invention in order to enhance its reliability is the optical isolation of power in the input/output modules and its supply through the independent input/output bus cable. This power is controlled by the controller, so that in the event of a problem, such as lack of line power, the controller will first shut off the opti-isolator power, forcing all outputs off, as part of its shutdown procedure. On start-up the opto-isolator power will remain off until the controller has established control over the outputs.

Electrical Operation of DC Input Modules

In conventional DC input modules for programmable controllers, the threshold DC value necessary to turn the input module on would often be determined by the internal circuitry or by some external adjustment. The present invention employs a novel approach to setting the DC threshold values necessary to turn the input module on. The present invention comprises a threshold generator which is compared with externally applied inputs. The threshold generator is compared with each of the DC inputs of the DC input module so that a DC input voltage of approximately half of the DC source voltage is necessary to turn the DC input module ON.

In FIGS. 13A-C, the DC threshold sensing circuitry for one input of a DC input module can be seen. The DC source value is applied to the V SOURCE terminal which in turn is applied to transistor Q3. The output from Q3 which is determined by the values of resistors R7 R8 is then applied to bias transistor Q1. Transistor Q1 and the value of the associated biasing resistors is chosen in order that Q1 remains off until the input voltage present at DCIN1 is of a sufficiently high threshold value in order to turn Q1 on, which in turn activates the remainder of the DC input module circuitry, including transistor Q2, (forming a portion of the current source indicator device) opto-isolator 27 and output driver transistor Q4.

Similar threshold and output driver circuitry (not shown) is used on the other three DC input points for each DC I/O input module.

Terminal Connector Construction

As discussed above in reference to FIGS. 2 and 3, input/output housing 24 incorporates a plurality of terminal connectors 30 for interconnected engagement with each input/output module 25. This interconnected, locked engagement along with the specific construction of the contacts of the terminal block 30 have been fully detailed above. However, in addition to these features, terminal block connector 30 also incorporates additional features for assisting and interconnecting equipment wiring to terminal connector 30. These features can best be understood by referring to FIGS. 11 and 12.

Each terminal connector 30 incorporates eight independent connection lines therein. As discussed above, the eight interconnection lines are employed to conductively connect to the four points available in each input and output module. In order to assist ease and speed of installation, each terminal connector incorporates a trapscrew assembly 70 mounted within terminal connector 30 and comprising a screw member 71 and a cooperating metal shoe 72 and an extruded copper cage or folded steel cage 203. Screw 71 comprises a boss member extending from the bottom thereof with the boss member having a first small diameter portion 73 and a large diameter portion 74. Shoe member 72 incorporates on its top surface thereof a cutout portion 75 which is cooperatively associated and engageable with small diameter portion 73.

Screw 71 is threadedly engaged with cage 203. Shoe member 72 with cutout portion 75 is then peripherally engaged about small diameter portion 73 of screw. Rotation of screw 71 causes shoe member 72 to move in unison. Consequently, when the equipment wiring is inserted into conductive engagement with terminal connector 30 through cooperating portals 76, the wires are securely locked in position by tightening screw 71.

As screw 71 is rotated in order to tighten upon any wiring inserted in portal 76, the tightening operation merely causes shoe portion 72 of trapscrew assembly 70 to firmly compress and securely engage the wiring mounted therein. Since the rotational movement of screw 71 is not able to reach the equipment wiring inserted in portal 76, connection problems common with prior art systems are completely eliminated. Furthermore, the construction of trapscrew assembly 70 in combination with portal 76 has been found to allow equipment wiring of up to 2 number 12 wires AWG (solid or stranded) to be securely and electrically connected by each trapscrew assembly 70. As best seen in FIG. 2, each trapscrew assembly 70 is in juxtaposed spaced relationship with an entry portal 77 in order to allow easy access to trapscrew assembly 70.

The final feature provided in the input/output assembly of the present invention can best be understood by referring to FIGS. 3 and 8. This feature comprises a coverplate 80 which is mounted along the entire length of input/output housing 24 and directly connected to terminal connectors 30. For purposes of illustration, coverplate 80 has been broken away in FIG. 3.

Coverplate 80 preferably comprises an elongated plastic strip which can be quickly and easily inserted on cooperating ribs of terminal connector 30. By covering the interconnection between terminal connector 30 and the equipment wiring, coverplate 80 provides a shielding to these wires thereby eliminating any undesirable contact that can be inadvertently made by operators with these wires. Furthermore, coverplate 80 also provides a writing surface as well as a mounting surface for terminal identifications and labelling. In the preferred embodiment, each of the eight terminals in each module is color coded to correspond with its associated module. Consequently, at a glance, any user will know whether he is dealing with an input or an output module as well be provided with any additional information required for proper operation. In this way, cover plate 80 adds convenience as well as safety to the input/output assembly of this invention.

It will best be seen that the objects set forth above among those made apparent from the preceding description are efficiently attained, and since certain changes may be made in the above construction without departing from the scope of the invention, it is intended that all matter contained in the above description or shown in the accompanying drawings shall be interpreted as illustrative and not in a limiting sense.

It is also to be understood that the following Claims are intended to cover all the generic and specific features of the invention herein described, and all statements of the scope of the invention which, as a matter of language, might be said to fall therebetween.

Having described my invention, what I claim as new and desire to secure by Letters Patent is:

1. An input/output assembly interconnected with a central processor to form a machine controller for receiving information from and providing operating instructions to external devices, comprising:
(A) an interconnecting support member incorporating means for communication with the central processor;
(B) at least one housing member incorporating
 (a) a central frame supportingly mounted to the support member,
 (b) electronic circuitry mounted to the frame and communicating with the communicating means of the support member,
 (c) connector assemblies, electronically interconnecting said electronic circuitry to an electronic module, and
  (1) being removably supportingly retained on the central frame in rigid, non-pivoting positions, and
  (2) comprising a plurality of flexible, resiliently deformable pin members for solderless, removable electronic engagement with both said circuitry and said electronic module, thereby assuring flexible, resiliently deformable receipt of mating connectors at any laterally offset angular relationship thereto, and
 (d) a terminal strip mounted to the frame and incorporating a plurality of contact lines for electronic interconnection with the external devices; and
(C) an electronic module removably mounted to the housing member and incorporating
 (a) a first connector for interconnected engagement with the connector assembly in a plurality of laterally offset insertion angles, and
 (b) a second connector for interconnected engagement with the contact lines of the terminal strip;
whereby, the electronic module is securely and easily mounted to the support frame of the housing member as well as electrically connected between the external devices and the central processor by simply engaging the first connector of the module with a connector assembly in any desired laterally offset insertion angle and then moving the module sideways for electronic engagement of the second connector with the terminal strip contacts.

2. The input/output assembly defined in claim 1, wherein the electronic module further comprises
 (c) a printed circuit board having four input or output points, and
 (d) a lightweight housing supportingly enveloping the printed circuit board, thereby providing an easily handled modular construction.

3. The input/output assembly defined in claim 1, wherein the first connector of the electronic module comprises a printed circuit board edge connector positioned along the rear surface of the module, and the second connector of the electronic module comprises a plurality of substantially flat fins positioned along the forward edge of the module and capable of sideways engagement.

4. The input/output assembly defined in claim 3, wherein the second connector is further defined as comprising a unitary, multi-contact assembly forming the front surface of the module and being wave soldered to the printed circuit board of the module.

5. The input/output assembly defined in claim 3, further comprising a plurality of electronic modules incorporating at least one input module and at least one output module, with each of the said modules removably mounted to the housing member and incorporating along a rear surface thereof pin receiving means for supportingly holding the module, and the housing is further defined as comprising
 (e) a plurality of position locating and holding pins mounted to the central frame and cooperating with pin receiving means formed on the module for cooperative engagement and supporting holding of the module in the plurality of laterally offset insertion angles encountered during interconnection with the housing member.

6. The input/output assembly defined in claim 1, wherein said support member comprises a laterally extending duct having support means formed on one surface thereof for interconnected engagement with the housing member and the communication means comprises
 (a) a multi-conductor cable extending from the central processor at the proximal end thereof, and
 (b) connectors spaced along the length of the cable to and including the distal end thereof, with each of said connectors being adapted for interconnected engagement with the circuitry of the 7. Input/output assembly defined in claim 6, wherein said cable further comprises a 50 connector ribbon cable with easily assembled snap-on connectors mounted along its length.

8. The input/output assembly defined in claim 6, wherein said support member supportingly holds and interconnects up to eight housing members, and each housing member further comprises:
 (f) address select means for providing a particular housing member with a particular address.

9. The input/output assembly defined in claim 8, wherein the address select means allows the housing member to be selectably addressed at any desired location between one and four.

10. The input/output assembly defined in claim 1, wherein the terminal strip is further defined as comprising a plurality of module contact receiving pins extending along one side thereof and positioned for simultaneously receiving the plurality of module contact pins through the lateral, sideways inter-engagement.

11. The input/output assembly defined in claim 10, wherein each of the plurality of contact pins of the terminal strip comprise tuning fork and shaped prongs and each of the plurality of contacts of the module comprise flat fins, thereby allowing simultaneous lateral, sideways inter-engagement of said plurality of module contact pins with said plurality of module contact receiving pins with assembly ease, while also assuring self-wiping cleaning interconnection.

12. The input/output assembly defined in claim 1, wherein the terminal strip further comprises a locking assembly slidably housed therein and incorporating at least one locking arm for interconnected, locked engagement with locking posts formed on the module.

13. Input/output assembly defined in claim 12, wherein the locking posts formed on the module comprise a bevelled surface and the locking arms of the locking assembly contained within the terminal strip comprises flexible, deformable material, thereby assuring flexible deformation of the locking arm upon forced interconnection with the posts of the module.

14. Input/output assembly defined in claim 12, wherein the locking assembly is positioned for being maintained in the open position by gravity forces when not in use, thereby assuring the locking assembly is automatically in the open position prior to module insertion and interconnection therewith.

15. The input/output assembly defined in claim 1, wherein the housing member further comprises
 (e) an elongated cover mountable to the central frame and extending substantially the entire length of the housing member for enclosing and protecting the electronic circuitry.

16. The input/output assembly defined in claim 15, wherein the cover is further defined as being
 (a) readily mounted to and removed from cooperating channels formed in the central frame, and
 (b) formed of metal for substantially eliminating electromagnetic interference.

17. The input/output assembly defined in claim 15, wherein the housing further comprises
 (f) mounting means formed in the top surface of the central frame and cooperatively engageable with support means formed in the support member.

18. The input/output assembly defined in claim 5, wherein said position locating and holding pins are further defined as being tapered with the widest portion thereof forming the base and being mounted along a rear wall of the central frame extending outwardly therefrom is forward facing manner positioned in juxtapose spaced relationship to the connector assemblies, thereby assuring cooperative supporting engagement of a module during angular insertion and interconnection with a connector assembly.

19. The input/output assembly defined in claim 18, wherein said position locating and holding pins are further defined as comprising a pair of pins associated with each connector assembly with one of said pair being positioned in space relationship to the upper edge of the connector assembly and the other of said pair being positioned in space relationship to the lower edge of the connector assembly.

20. An expandable input/output assembly interconnected with a central processor to form a machine controller for receiving information from and providing operating instructions to external devices, comprising:
(A) a support member incorporating
 (a) means for communicating with the central processor, and
 (b) a plurality of housing engagement zones with each of said zones having means for interconnecting with the communication means;
B. at least one housing member incorporating (a) an elongated frame supportingly mounted to one of said housing engagement zones of the support member, (b) electronic circuitry mounted to the frame with a portion thereof electronically engaged with the means for communicating with the central processor, (c) a plurality of connector assemblies for supporting and electronically interconnecting said eletronic circuitry to an electronic module, each of said connector assemblies comprising (1) a connector housing removably mounted to the central frame in a rigid, non-pivoting position and incorporating a plurality of flexible, resiliently deformable pin members for solderless, removable electronic engagement with said circuitry and said electronic module, (2) supporting posts positioned in juxtaposed spaced relationship to the connector housing for cooperative engagement with cooperating recesses formed in the electronic module, and (3) both the support posts and the connector housing being cooperatively associated for supportingly holding the module in a plurality of laterally offset insertion angles while simultaneously establishing an electronic interconnection therewith, and (d) a terminal strip mounted to the frame and incorporating a plurality of independent contacts for electronic interconnection between a plurality of external devices and the electronic module, with each of said contacts comprising (1) an external device contact point adapted for secure non-mandatory disengageable electrical contact with an external device, and (2) a contact engagement for rapid insertion and removal therefrom of a contact of the electronic module;

(C) an electronic module removably mounted to the housing member and incorporating (a) a lightweight easily handled housing having support post cooperating recesses formed in the rear surface thereof in order to assure cooperative, supporting interengagement with said support posts of the frame, and (b) a printed circuit board mounted in the housing and having (1) a first connector formed in the printed circuit board and positioned for interengagement with the connector housing in a plurality of laterally offset insertion angles, and (2) a second connector arrayed along a forward edge of the printed circuit board and positioned for rapid interconnected engagement and disengagement with the contacts of the terminal strip;

whereby, an electronic module is easily securely mounted to the frame of the housing member and simultaneously electrically connected between the external devices and the central processor by simply engaging the first connector of the module with the connector unit in any desired laterally offset insertion angle and then moving the module sideways for electronic engagement of the second connector with the terminal strip contacts, and the input/output assembly is quickly and easily expanded by adding more module to an existing housing member or adding more housing members and modules to the support member.

* * * * *

UNITED STATES PATENT AND TRADEMARK OFFICE
CERTIFICATE OF CORRECTION

PATENT NO. : 4,215,386
DATED : July 29, 1980

INVENTOR(S) : Jay M. Prager, et al

It is certified that error appears in the above-identified patent and that said Letters Patent are hereby corrected as shown below:

Column 1, line 38, please delete the word "removable" and substitute therefore the word --removal--.

Column 2, line 54, please delete the word "for" and substitute therefore the word --from--.

Column 5, line 1, please delete the word "the" and substitute therefore the word --for--.

Column 5, line 32, please delete the word "incorporates" and substitute therefore the word --incorporate--.

Column 6, line 5, please delete the word "conjuction" and substitute therefore the word --conjunction--.

Column 6, line 7, please delete "1/o" and substitute therefore --I/O--.

Column 6, line 52, please delete the word "cooperation" and substitute therefore the word --cooperative--.

Column 6, line 53, please delete the word "FIGS." and substitute therefore the word --FIG.--.

Column 8, line 19, please delete the word "eliminte" and substitute therefore the word --eliminate--.

Column 8, line 22, please delete the word "servicable" and substitute therefore the word --serviceable--.

UNITED STATES PATENT AND TRADEMARK OFFICE
CERTIFICATE OF CORRECTION

PATENT NO. : 4,215,386

DATED : July 29, 1980

INVENTOR(S) : Jay M. Prager, et al

It is certified that error appears in the above-identified patent and that said Letters Patent are hereby corrected as shown below:

Column 8, line 50, please delete the word "board" and substitute therefore the word --block--.

Column 8, line 55, please delete the word "Grooves" and substitute therefore the word --grooves--.

Column 11, line 23, please delete the word "redy" and substitute therefore the word --ready--.

Column 12, line 41, please delete the word "useability" and substitute therefore the word --usability--.

Column 12, line 54, please delete the word "inout" and substitute therefore the word --input--.

Column 13, lines 26 & 27, please delete the word "optoisolator" and substitute therefore the word --opto-isolator--.

Column 14, line 26, please delete the word "opti-isolator" and substitute therefore the word --opto-isolator--.

Column 14, line 56, please delete the word "device" and substitute therefore the word --drive--.

Column 17, Claim 6, line 42, insert the word --housing member.-- after the second "the".

Column 17, Claim 11, line 65, please delete the word "and" after the word "fork".

UNITED STATES PATENT AND TRADEMARK OFFICE
CERTIFICATE OF CORRECTION

PATENT NO. : 4,215,386
DATED : July 29, 1980
INVENTOR(S) : Jay M. Prager, et al

It is certified that error appears in the above-identified patent and that said Letters Patent are hereby corrected as shown below:

Column 18, Claim 18, line 45, please delete the word "is" and substitute therefore the word --in--.

Column 18, Claim 18, lines 45 & 46, please delete the word "juxtapose" and substitute therefore the word --juxtaposed--.

Column 18, Claim 19, line 54, please delete the word "space" and substitute therefore the word --spaced--.

Column 18, Claim 19, line 56, please delete the word "space" and substitute therefore the word --spaced--.

Column 19, Claim 20, line 10, please delete the word "eletronic" and substitute therefore the word --electronic--.

Signed and Sealed this

Ninth Day of December 1980

[SEAL]

Attest:

Attesting Officer

SIDNEY A. DIAMOND

Commissioner of Patents and Trademarks